(12) United States Patent
Kim et al.

(10) Patent No.: US 12,513,810 B2
(45) Date of Patent: Dec. 30, 2025

(54) EUV GENERATOR, EUV LITHOGRAPHY APPARATUS INCLUDING THE SAME, AND METHOD FOR FABRICATING SEMICONDUCTOR DEVICE USING THE SAME

(71) Applicant: SAMSUNG ELECTRONICS CO., LTD., Suwon-si (KR)

(72) Inventors: Hyeon Jin Kim, Seoul (KR); Sung Hyup Kim, Hwaseong-si (KR); Jeong-Gil Kim, Hwaseong-si (KR); Jeong Du Kim, Seoul (KR); Sang Hoon Lee, Seoul (KR); In Jae Lee, Hwaseong-si (KR); Jong Gu Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 647 days.

(21) Appl. No.: 17/691,471

(22) Filed: Mar. 10, 2022

(65) Prior Publication Data
US 2023/0046424 A1 Feb. 16, 2023

(30) Foreign Application Priority Data
Aug. 11, 2021 (KR) ........................ 10-2021-0105874

(51) Int. Cl.
*H05G 2/00* (2006.01)
*G03F 7/00* (2006.01)
*H01L 21/3065* (2006.01)

(52) U.S. Cl.
CPC ....... *H05G 2/0094* (2024.08); *G03F 7/70033* (2013.01); *H01L 21/3065* (2013.01); *H05G 2/009* (2024.08)

(58) Field of Classification Search
CPC .. H05G 2/008; G03F 7/70033; H01L 21/3065
See application file for complete search history.

(56) References Cited

U.S. PATENT DOCUMENTS

| | | | |
|---|---|---|---|
| 9,420,678 B2 | 8/2016 | Bykanov et al. | |
| 9,989,758 B2 | 6/2018 | Kuritsyn et al. | |
| 10,237,960 B2 | 3/2019 | Ershov et al. | |
| 10,687,410 B2 | 6/2020 | Yang et al. | |
| 10,813,206 B2 * | 10/2020 | Fukuda | ............... G03F 7/70141 |

(Continued)

FOREIGN PATENT DOCUMENTS

| KR | 200464096 B1 | 12/2012 |
|---|---|---|
| KR | 1020200022498 A | 3/2020 |

(Continued)

*Primary Examiner* — David J Makiya
(74) *Attorney, Agent, or Firm* — Muir Patent Law, PLLC

(57) ABSTRACT

An extreme ultraviolet light generator includes a collector including a first focus and a second focus, a droplet feeder configured to provide a source droplet toward the first focus of the collector, a laser generator configured to irradiate a laser toward the first focus of the collector, an airflow controller between the first focus and the second focus of the collector, the airflow controller having a ring shape, and the airflow controller including at least one slit, and a first part and a second part hinged to each other, and a control gas feeder configured to provide a control gas towards the at least one slit of the airflow controller.

20 Claims, 13 Drawing Sheets

(56) References Cited

U.S. PATENT DOCUMENTS

| | | |
|---|---|---|
| 10,871,647 B2 | 12/2020 | Lin et al. |
| 10,880,981 B2 * | 12/2020 | Chien ................. G03F 7/70958 |
| 12,007,694 B2 * | 6/2024 | Yen ..................... G03F 7/70166 |
| 12,007,699 B2 * | 6/2024 | Kerssemakers ...... H05G 2/0094 |
| 2020/0236768 A1 * | 7/2020 | Wu ..................... G03F 7/70916 |
| 2021/0141311 A1 | 5/2021 | Labetski et al. |

FOREIGN PATENT DOCUMENTS

| | | | | |
|---|---|---|---|---|
| TW | 1717437 B | * | 2/2021 | ......... G03F 7/70033 |
| WO | WO-2019090139 A1 | * | 5/2019 | ............. G02B 6/002 |

* cited by examiner

FIG. 5
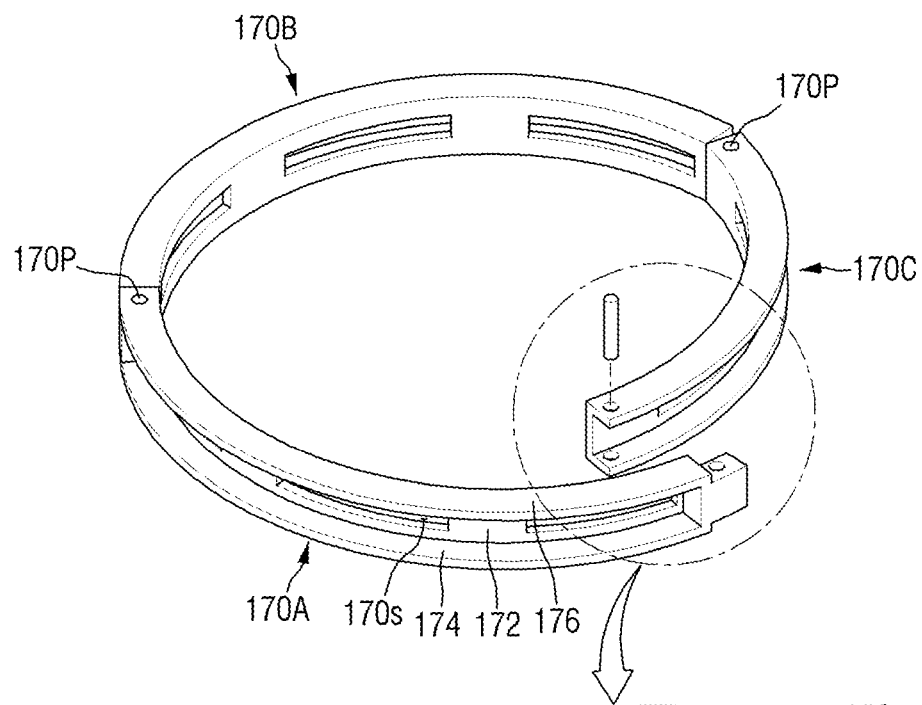
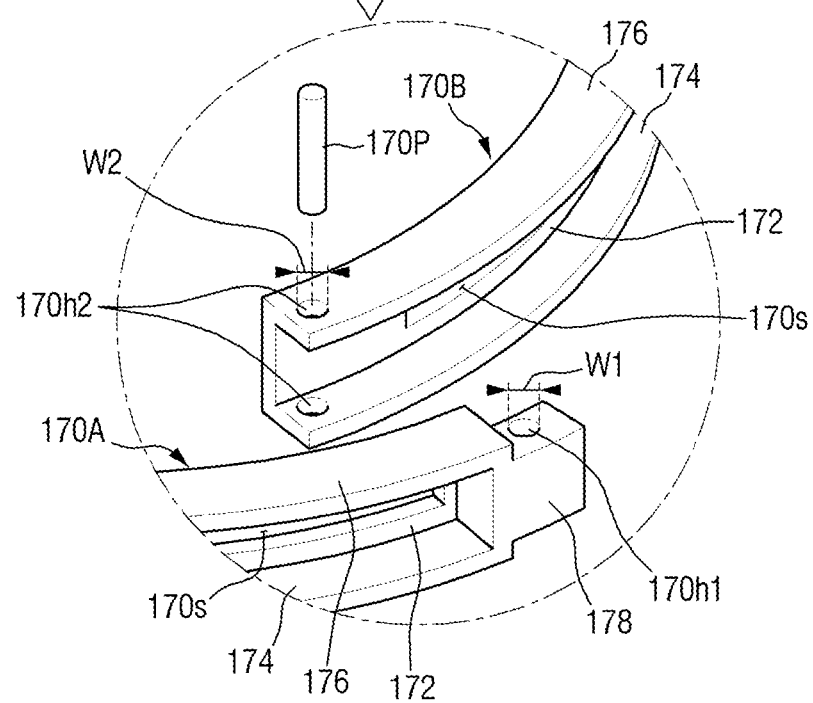

FIG. 11
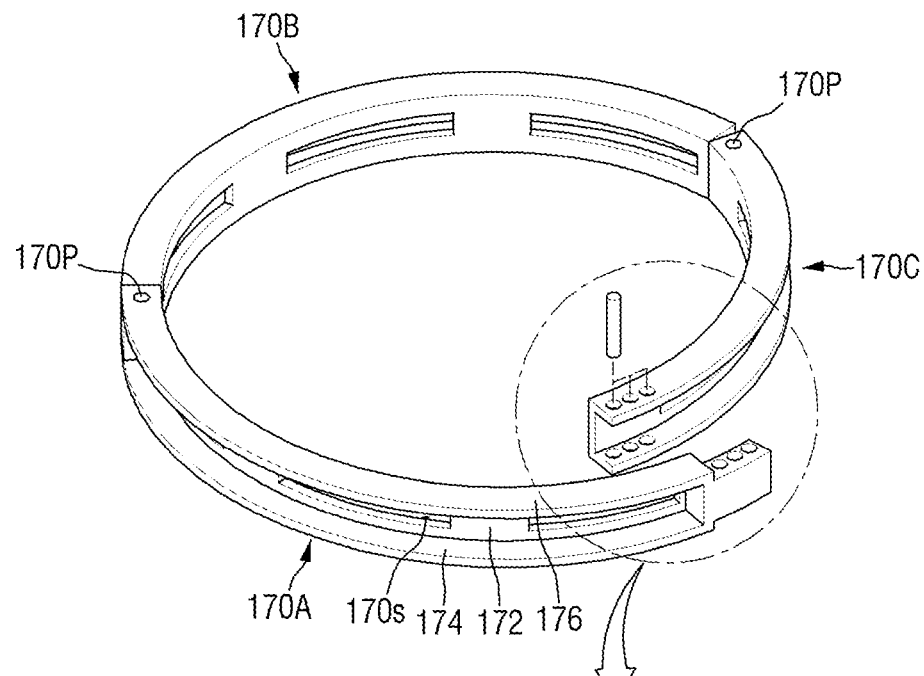
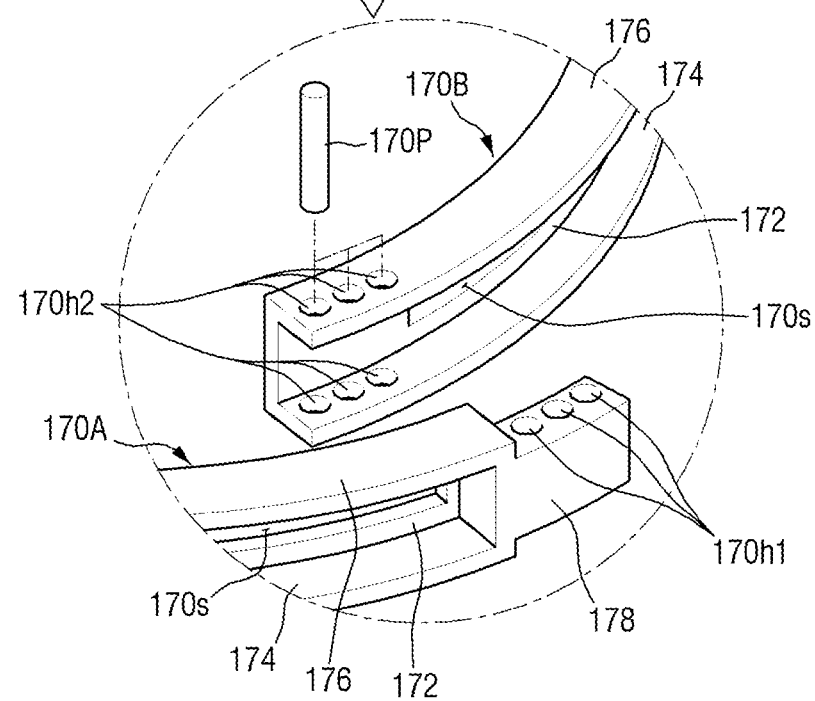

EUV GENERATOR, EUV LITHOGRAPHY APPARATUS INCLUDING THE SAME, AND METHOD FOR FABRICATING SEMICONDUCTOR DEVICE USING THE SAME

CROSS-REFERENCE TO RELATED APPLICATION

This application claims priority to Korean Patent Application No. 10-2021-0105874, filed on Aug. 11, 2021, and all the benefits accruing therefrom under 35 U.S.C. § 119, the disclosure of which is incorporated herein by reference in its entirety.

BACKGROUND

1. Field

The present disclosure relates to an extreme ultraviolet (EUV) light generator, an EUV lithography apparatus including the same, and a method for fabricating a semiconductor device using the same. More specifically, the present disclosure relates to an EUV light generator that utilizes laser produced plasma (LAP) method by laser irradiation, an EUV lithography apparatus including the same, and a method for fabricating a semiconductor device using the same.

2. Description of the Related Art

As design rules of semiconductor devices gradually decrease, there is a need for techniques for forming patterns of smaller sizes. To satisfy such a technical requirement, an extreme ultraviolet (EUV) lithography process that utilizes EUV light having a short wavelength as a light source may be used. For example, in the mass production process of nano-class semiconductor devices of 40 nm or less, EUV light having a wavelength of about 10 nm to about 14 nm may be used.

A light source plasma generation method for generating EUV light may include a laser produced plasma (LPP) method by laser irradiation, and a discharge produced plasma (DPP) method by gas discharge operated by a pulse power technology. Among them, the LPP method by laser irradiation may generate EUV light from plasma generated by irradiating a target substance with a laser.

SUMMARY

According to an aspect of the present disclosure, there is provided a method for fabricating a semiconductor device, the method including forming a photoresist layer on a substrate including a target layer, loading the substrate onto a reticle stage, exposing the photoresist layer to extreme ultraviolet generated from an extreme ultraviolet generator, developing the photoresist layer exposed to the extreme ultraviolet to form a photoresist pattern, and processing the target layer, using the photoresist pattern, wherein the extreme ultraviolet generator includes a collector having a first focus and a second focus farther than the first focus, a droplet feeder that provides a source droplet to the first focus of the collector, a laser generator that irradiates the first focus of the collector with a laser, a ring-shaped airflow control member including at least one slit between the first focus and the second focus, and a control gas feeder that supplies a control gas toward the slit, and wherein the airflow control member includes a first part and a second part hinged to each other.

According to an aspect of the present disclosure, there is provided an extreme ultraviolet generator including a collector which has a first focus and a second focus farther than the first focus, a droplet feeder that provides a source droplet to the first focus of the collector, a laser generator that irradiates the first focus of the collector with a laser, a ring-shaped airflow control member that includes at least one slit between the first focus and the second focus, and a control gas feeder that provides a control gas towards the slit, wherein the airflow control member includes a first part and a second part hinged to each other.

According to an aspect of the present disclosure, there is provided an extreme ultraviolet generator including a chamber, a laser generator which irradiates a laser into the chamber, a droplet feeder which provides a source droplet into the chamber, the source droplet irradiated by the laser to generate extreme ultraviolet, a focus cap which includes a discharge port that emits the extreme ultraviolet, on the chamber, a collector which concentrates the extreme ultraviolet generated from the source droplet on the discharge port, a coupling member that connects the chamber and the focus cap, a ring-shaped airflow control member which is installed inside the coupling member and includes at least one slit, and a control gas feeder which provides a control gas into the chamber through the slit, wherein the airflow control member includes a first part and a second part hinged to each other.

BRIEF DESCRIPTION OF THE DRAWINGS

Features will become apparent to those of skill in the art by describing in detail exemplary embodiments with reference to the attached drawings, in which:

FIGS. 4 and 5 are perspective views of an airflow control member of the EUV generator according to some embodiments.

FIG. 11 is another perspective view of an airflow control member of the EUV generator according to some embodiments.

DETAILED DESCRIPTION

Hereinafter, an EUV light generator (i.e., EUV generator) according to exemplary embodiments will be described referring to FIGS. 1 to 11.

Figure 1:
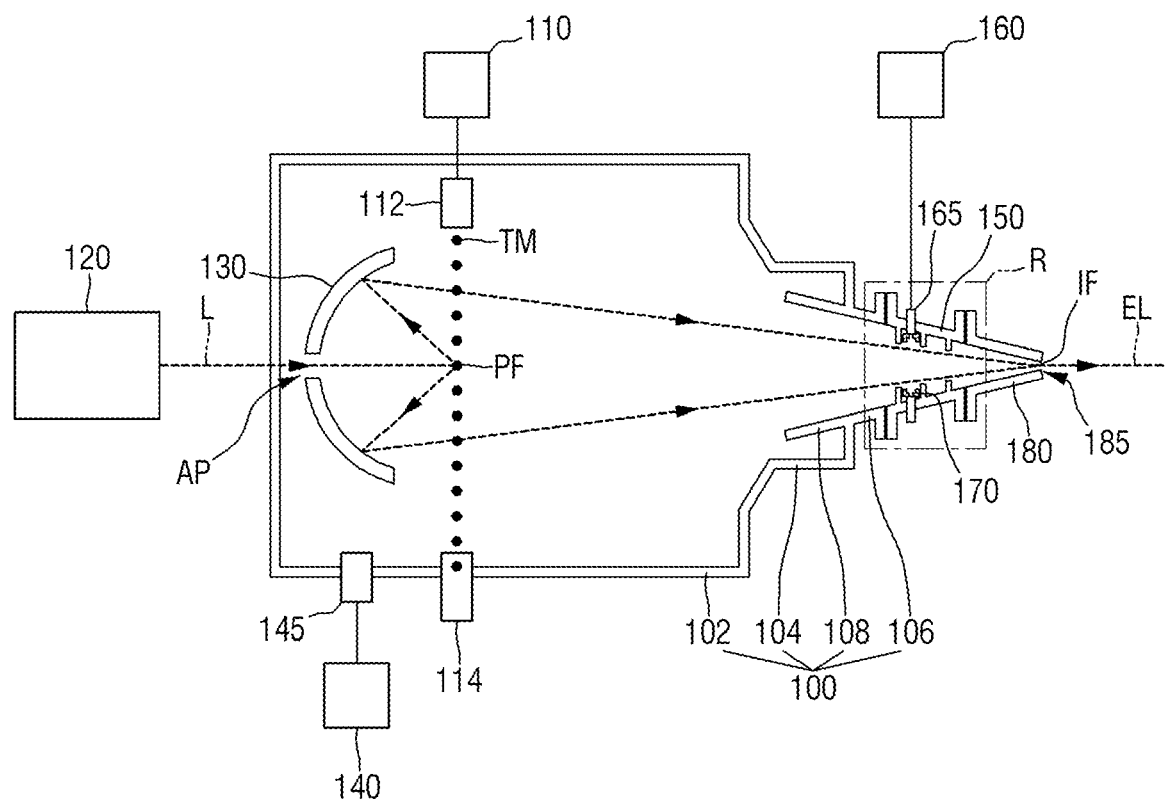
FIG. 1 is a schematic diagram of an EUV generator according to some embodiments.
Figure 2:
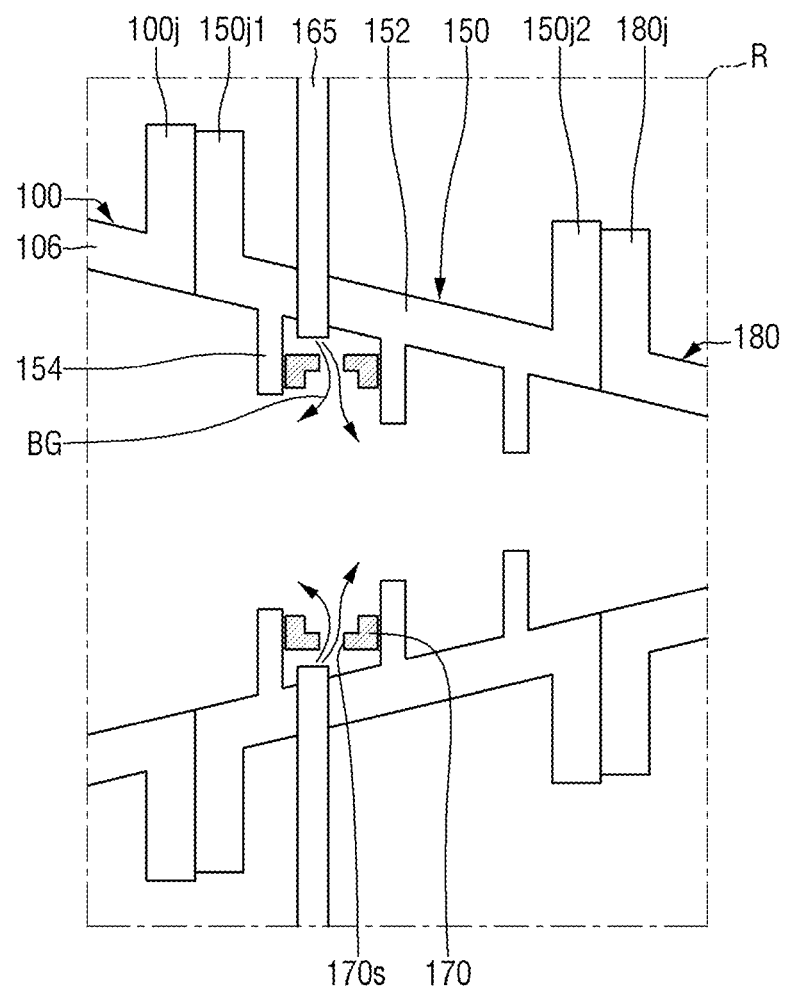
FIG. 2 is an enlarged view of region R of FIG. 1.
Figure 3:
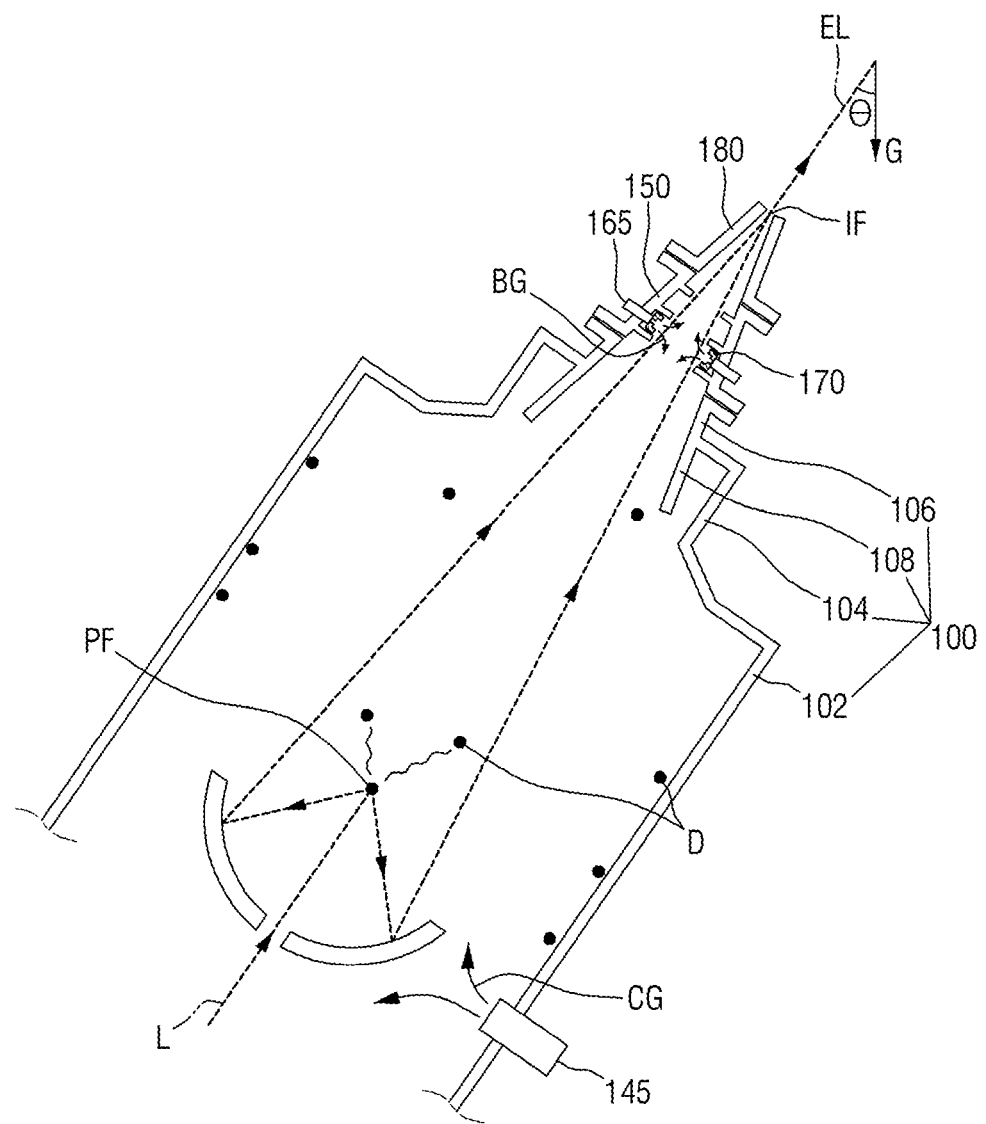
FIG. 3 is a conceptual diagram of the EUV generator of FIG. 1.
Figure 4:
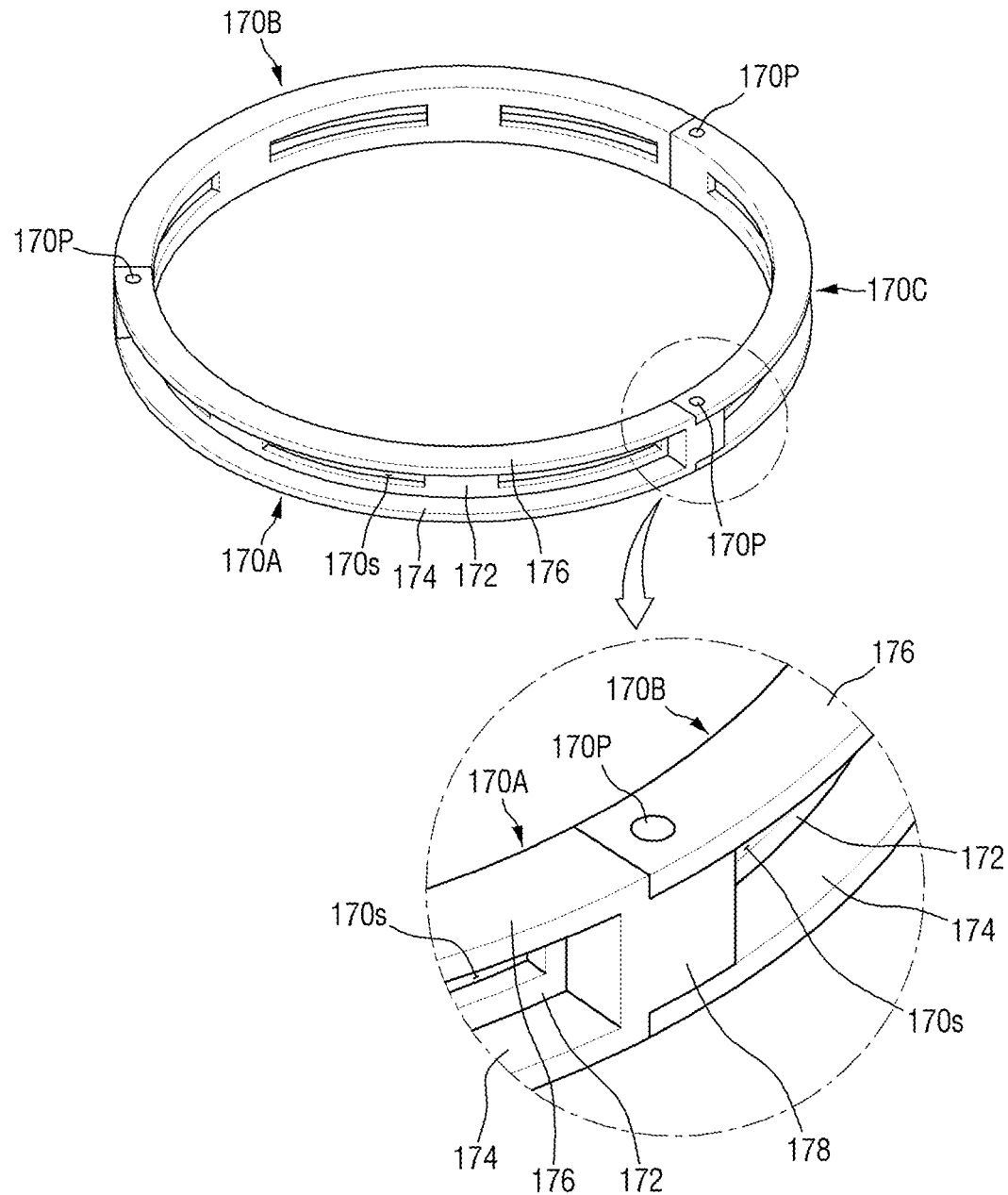
Figure 6:
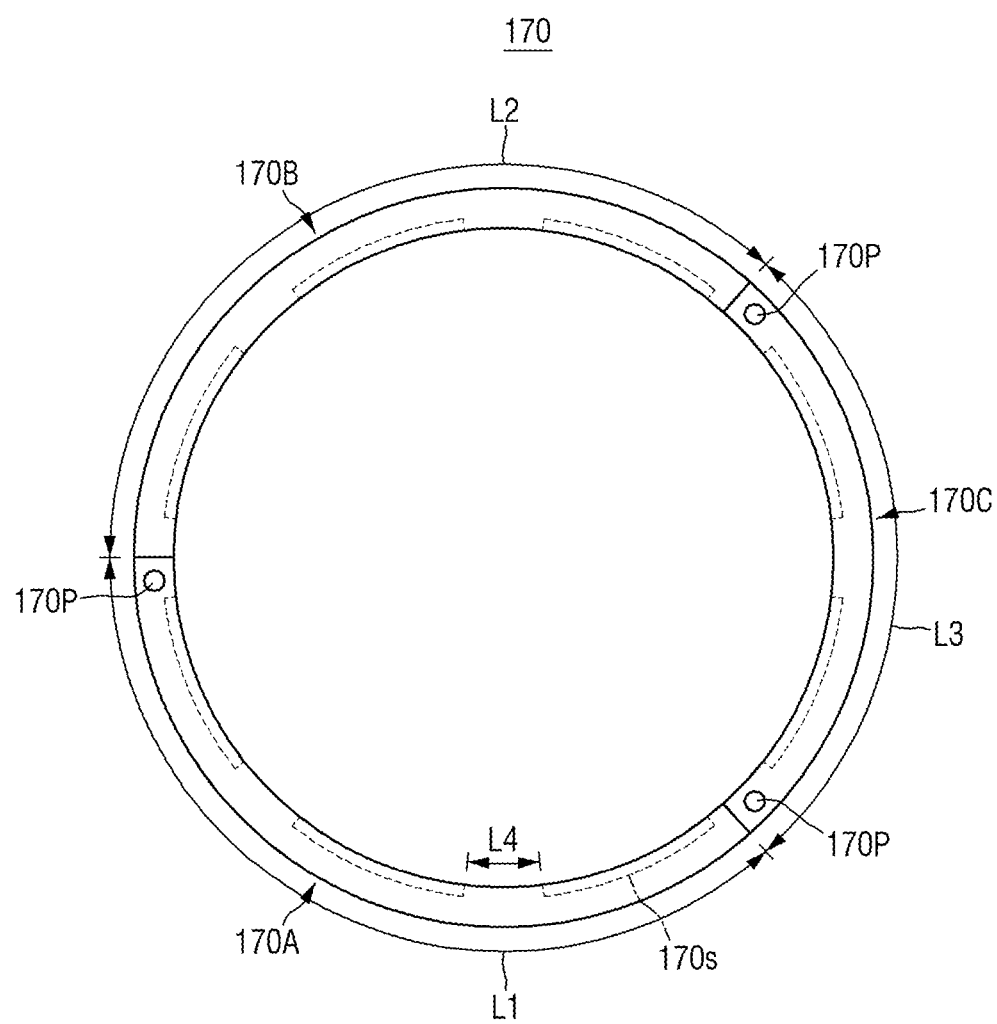
FIG. 6 is a plan of the airflow control members of FIGS. 4 and 5.
Figure 7:
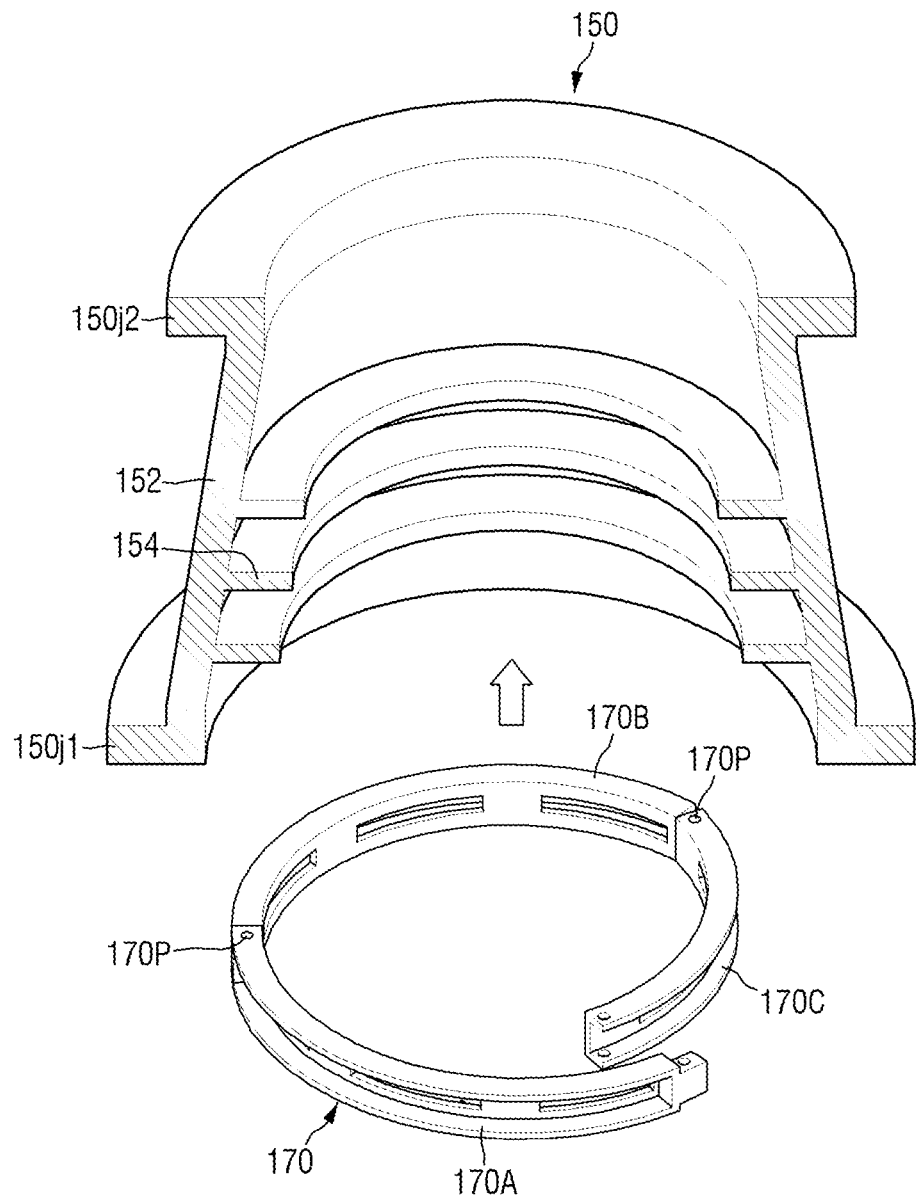
FIGS. 7 and 8 are diagrams of the installation of the airflow control member of FIGS. 4 and 5.
Figure 8:
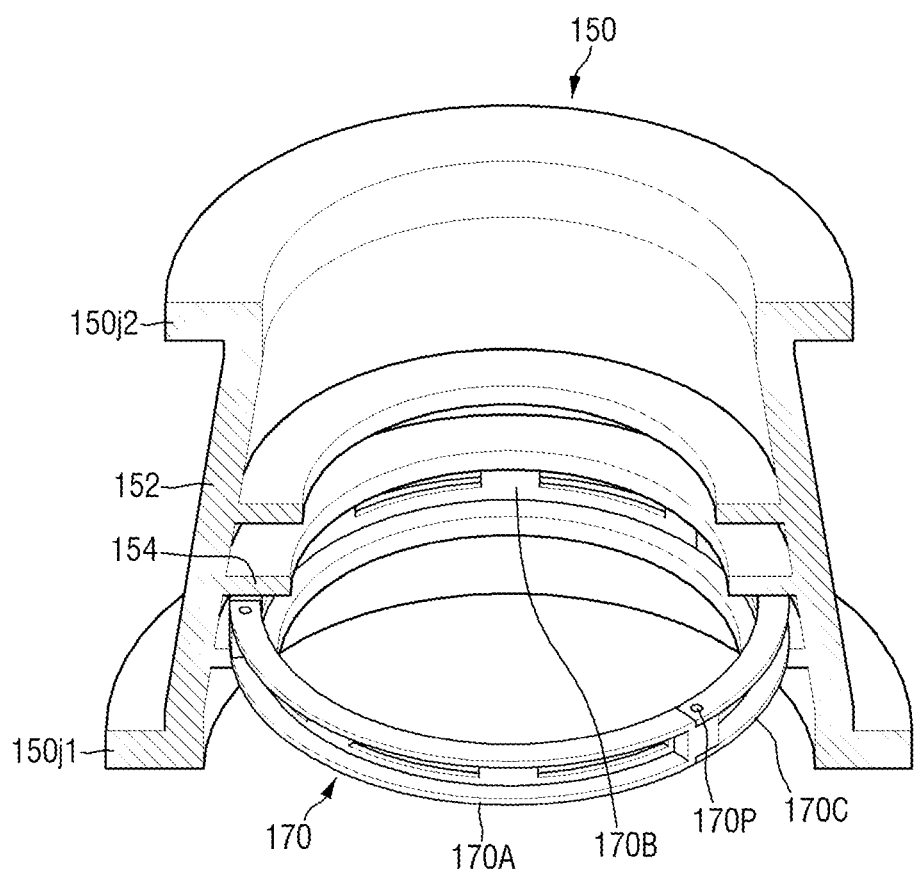

FIG. 1 is a schematic diagram of an EUV light generator according to some embodiments. FIG. 2 is an enlarged view of region R of FIG. 1. FIG. 3 is a conceptual diagram of the EUV light generator of FIG. 1. FIGS. 4 and 5 are perspective views of an airflow control member of the EUV light generator according to some embodiments. FIG. 6 is a plan view of the airflow control members of FIGS. 4 and 5. FIGS. 7 and 8 are diagrams of the installation of the airflow control member of FIGS. 4 and 5.

Referring to FIGS. 1 to 3, the EUV light generator according to some embodiments may include a chamber 100, a droplet feeder 110, a droplet trap 114, a laser generator 120, a collector 130, a cleaning gas feeder 140, a coupling member 150, a control gas feeder 160, an airflow control member 170, and a focus cap 180.

The chamber 100 may provide a space in which plasma is generated to generate extreme ultraviolet light EL to be described below. In some embodiments, the interior of chamber 100 may be provided in vacuum (e.g., about 1 torr or less). The interior of the chamber 100 provided in vacuum may facilitate the progress of the laser L and/or the extreme ultraviolet light EL.

The collector 130 may be placed inside the chamber 100. The collector 130 may have a first focus PF, and a second focus IF farther than the first focus PF. For example, the collector 130 may include a curved surface of a prolate ellipsoid shape having the first focus PF, and a second focus IF farther than the first focus PF.

The laser generator 120 may generate a laser L and irradiate the laser L into the chamber 100. The laser L generated from the laser generator 120 may be irradiated toward the first focus PF of the collector 130. For example, the collector 130 may include an aperture AP that penetrates its center. The collector 130 may be a prolate ellipsoid having a shape that converges concavely toward the aperture AP. The laser L may be generated from the back side of the collector 130, pass through the aperture AP, and be irradiated to the first focus PF of the collector 130. The laser L may be, e.g., a $CO_2$ laser beam or an Nd:YAG (Neodymium-doped Yttrium Aluminum Garnet) laser beam.

The droplet feeder 110 may supply source droplets TM as a target substance for generating the extreme ultraviolet light EL, e.g., the droplet feeder 110 may be connected to a supply of source droplets TM. For example, the droplet feeder 110 may supply the source droplets TM into the chamber 100, using the droplet supply nozzle 112 installed in the chamber 100. The droplet supply nozzle 112 may provide the source droplets TM into the chamber 100 at a constant cycle. The source droplets TM provided into the chamber 100 may pass through the first focus PF of the collector 130. At the first focus PF, the source droplets TM may be irradiated by the laser L generated from the laser generator 120 to generate plasma.

In some embodiments, the laser generator 120 may generate plasma from the source droplet TM, in the manner of irradiating the source droplet TM, which is a primary target, with a pre-pulse laser beam to generate a secondary target, and irradiating the secondary target with a main-pulse laser beam. The pre-pulse laser beam may be, e.g., an Nd:YAG laser beam having a wavelength of about 1064 nm. The main-pulse laser beam may be, e.g., a $CO_2$ laser beam having a wavelength of about 10.6 μm.

The source droplets TM may include at least one extreme ultraviolet emitting element, e.g., tin (Sn), Xenon (Xe), lithium (Li), titanium (Ti) and the like, which is irradiated by the laser L and has an emission line of a wavelength in the EUV range (e.g., about 10 nm to about 14 nm). The extreme ultraviolet emitting element may be present in the form of droplets and/or solid particles contained inside the droplets.

In some embodiments, the source droplets TM may include tin (Sn). For example, a source droplets TM may include pure tin, a tin compound, a tin alloy or a combination thereof. The tin compound may include, e.g., at least one of $SnBr_4$, $SnBr_2$ and SnH. The tin alloy may include, e.g., at least one of Sn—Ga, Sn—In, and Sn—In—Ga.

The collector 130 may selectively collect and reflect extreme ultraviolet light having a wavelength in the extreme ultraviolet range (e.g., about 10 nm to about 14 nm) among light of various wavelengths emitted from the plasma generated from the source droplet TM. Further, the extreme ultraviolet light EL generated at the first focus PF may be reflected to be directed toward the second focus IF by the collector 130. That is, the extreme ultraviolet light EL may be intensively discharged from the second focus IF by the collector 130.

In some embodiments, the collector 130 may include a multilayer mirror that provides an elliptical reflective surface. For example, the multilayer mirror may include a structure in which a plurality of films, e.g., including at least one of a molybdenum film (Mo film), a silicon film (Si film), a silicon carbide film (SiC film), a boron carbide film ($B_4C$ film), a molybdenum carbide film ($Mo_2C$ film), and a silicon nitride film ($Si_3N_4$), are alternately stacked one by one.

In some embodiments, the chamber 100 may include a first tubular portion 102, a second tubular portion 104, an opening portion 106, and a guide portion 108. For example, referring to FIG. 1, the first tubular portion 102, the second tubular portion 104, the opening portion 106, and the guide portion 108 may be integral with each other, e.g., formed as a single and seamless unit.

The first tubular portion 102 may have a tubular structure that provides a space in which the collector 130 is placed, and a space in which plasma is generated from the first focus PF of the collector 130. The second tubular portion 104 may have a tubular structure that communicates, e.g., in fluid communication, with the first tubular portion 102 and has a diameter smaller than that of the first tubular portion 102, e.g., the collector 130 and second tubular portion 104 may be at opposite sides of the first tubular portion 102. The second tubular portion 104 may communicate with the first tubular portion 102 along a direction of the extreme ultraviolet light EL toward the second focus IF. For example, one end of the first tubular portion 102 may be narrow to define the second tubular portion 104, and the extreme ultraviolet light EL may be irradiated toward the second tubular portion 104.

The opening portion 106 may extend, e.g., continuously, from the second tubular portion 104, e.g., the second tubular portion 104 may be between the first tubular portion 102 and the opening portion 106. The opening portion 106 may provide a region in which the coupling member 150 is coupled to the chamber 100. For example, the opening portion 106 may be a tubular structure extending from the outer surface of the second tubular portion 104 along the direction of the extreme ultraviolet light EL propagation toward the second focus IF, e.g., along a direction oriented from the first focus PF toward the second focus IF.

The guide portion 108 may guide the extreme ultraviolet light EL toward the second focus IF. For example, the guide portion 108 may be a tubular structure extending from the inner surface of the second tubular portion 104 toward the collector 130. For example, as illustrated in FIG. 1, the guide portion 108 may extend through the second tubular portion 104 toward the first tubular portion 102, e.g., so the extreme ultraviolet light EL may be transmitted through the guide portion 108 without being incident on sidewalls of the second tubular portion 104.

The droplet trap 114 may be installed to face the droplet supply nozzle 112. The droplet trap 114 may collect unused droplets (i.e., not participating in the plasma generation reaction) of the source droplets TM provided from the droplet feeder 110. For example, the source droplets TM may flow along a linear direction from the droplet supply nozzle 112 toward the droplet trap 114. In some embodiments, the droplet trap 114 may include a magnetic material for effectively capturing the source droplets TM.

The cleaning gas feeder 140 may supply a cleaning gas (CG in FIG. 3) into the chamber 100, e.g., the cleaning gas feeder 140 may be connected to a supply of a cleaning gas. For example, the cleaning gas feeder 140 may supply the cleaning gas CG into the chamber 100 using a cleaning gas supply nozzle 145 installed in the chamber 100, e.g., the cleaning gas supply nozzle 145 may be inserted into the chamber 100 in a region adjacent to the collector 130. The cleaning gas CG may be provided to flow through the chamber 100, e.g., flow from a region adjacent to the collector 130 through the chamber 100 toward the opening portion 106 of the chamber 100. Therefore, the cleaning gas CG may prevent debris, e.g., fine particles (D of FIG. 3) that did not turn into plasma, from being deposited on optical elements, e.g., the collector 130, inside the chamber 100. For example, the cleaning gas CG may be provided to flow along the inner surface of the chamber 100 and the surface of the collector 130. Although only one cleaning gas supply nozzle 145 penetrating the chamber 100 is shown in FIGS. 1 to 3, this is merely an example, and the position and number of the cleaning gas supply nozzles 145 may vary as necessary.

In some embodiments, the cleaning gas CG may include hydrogen ($H_2$) or hydrogen radicals ($H^*$) obtained from it. If the debris D contains tin (Sn), the cleaning gas CG containing hydrogen ($H_2$) and/or hydrogen radicals ($H^*$) may convert the debris D into a volatile tin compound, e.g., $SnH_4$, and purge the debris from the chamber 100. In some embodiments, the cleaning gas CG may be provided inside the chamber 100 in the form of a mixture of hydrogen ($H_2$) and/or hydrogen radicals ($H^*$) with oxygen ($O_2$) and/or oxygen radicals ($O^*$). In some other embodiments, the cleaning gas CG may include an inert gas, e.g., helium (He) gas, argon (Ar) gas, and nitrogen ($N_2$) gas.

The coupling member 150 may be installed on the chamber 100 along the direction of the extreme ultraviolet light EL, i.e., directed along a direction oriented from the first focus PF toward the second focus IF. For example, the coupling member 150 may be installed on the opening portion 106 of the chamber 100, e.g., the opening portion 106 may be between the second tubular portion 104 and the coupling member 105 along a direction oriented from the first focus PF to the second focus IF. The coupling member 150 may be a hollow tubular structure through which the extreme ultraviolet light EL penetrates. For example, the coupling member 150 may have a structure of a hollow truncated cone shape that communicates, e.g., in fluid communication, with the chamber 100. The coupling member 150 may be used to connect the focus cap 180 to the chamber 100.

In some embodiments, as shown in FIG. 2, the coupling member 150 may include a side wall portion 152, a first coupling plate portion 150j1, and a second coupling plate portion 150j2. The side wall portion 152 may be a structure of a hollow truncated cone shape having a hollow through which extreme ultraviolet EL light penetrates. The first coupling plate portion 150j1 may provide a region for fixing the coupling member 150 to the chamber 100, e.g., to the opening portion 106, and second coupling plate portion 150j2 may provide a region for fixing the focus cap 180 to the coupling member 150.

In detail, the chamber 100 may include a chamber upper plate portion 100j that extends from one end of the opening portion 106. The first coupling plate portion 150j1 may extend from the outer surface of the side wall portion 152 and face the chamber upper plate portion 100j. The chamber upper plate portion 100j and the first coupling plate portion 150j1 may be fixed to each other by, e.g., screw coupling or the like. The focus cap 180 may include a cap lower plate portion 180j that extends from one end thereof. The second coupling plate portion 150j2 may extend from the outer surface of the side wall portion 152 and face the cap lower plate portion 180j. The cap lower plate portion 180j and the second coupling plate portion 150j2 may be fixed to each other by, e.g., screw coupling or the like.

The airflow control member 170 (i.e., an airflow controller) may have a ring-shaped structure through which extreme ultraviolet light EL penetrates, e.g., an opening through the ring-shaped airflow control member 170 may be aligned with the hollow space of the coupling member 150 for fluid passage therethrough. The airflow control member 170 may be placed inside the coupling member 150. For example, the coupling member 150 may include a mounting portion 154 that provides a region for installing the airflow control member 170. The airflow control member 170 may be installed inside the coupling member 150 by being placed on the mounting portion 154. The airflow control member 170 may include at least one slit 170s. The airflow control member 170 will be described more specifically later in the description of FIGS. 4 to 8.

The control gas feeder 160 may supply a control gas (e.g., control gas BG in FIG. 3) toward the slit 170s of the airflow control member 170, e.g., the control gas feeder 160 may be connected to a supply of a control gas. For example, the control gas feeder 160 may supply the control gas BG toward the slit 170s, using the control gas supply nozzle 165 penetrating the side wall portion 152 of the coupling member 150. The control gas BG provided through the slit 170s may block the airflow flowing through the chamber 100 from flowing back toward the discharge port 185. For example, as shown in FIG. 3, the control gas BG may block the backflow of the cleaning gas CG which is supplied from the cleaning gas supply nozzle 145 and directed toward the discharge port 185, e.g., the control gas BG may block the cleaning gas CG from flowing into the discharge port 185. In FIGS. 1 to 3, although only two control gas supply nozzles 165 penetrating the side wall portion 152 are shown on both sides of the airflow control member 170, this is merely an example, and the position and number of the control gas supply nozzles 165 may vary as needed.

For example, the control gas BG may include hydrogen ($H_2$) gas. In another example, the control gas BG may include the same material as the cleaning gas CG. In yet another example, the control gas BG may include an inert gas, e.g., helium (He) gas, argon (Ar) gas, and nitrogen ($N_2$) gas.

The focus cap 180 may be placed on the coupling member 150 along the direction of the extreme ultraviolet light EL, i.e., along a direction oriented from the first focus PF toward the second focus IF. The focus cap 180 may be a tubular structure with a hollow space therethrough through which the extreme ultraviolet light EL penetrates. For example, the focus cap 180 may be a hollow cone structure that communicates with the coupling member 150. The focus cap 180 may include a discharge port 185 from which the extreme ultraviolet light EL is discharged. For example, the discharge port 185 may be defined by a narrow opening of the hollow cone formed by the focus cap 180. The second focus IF of the collector 130 may be located inside the discharge port 185. The extreme ultraviolet light EL may be provided to a lithography device, e.g., a scanner or a stepper, through the discharge port 185.

In some embodiments, the discharge port 185 may discharge the extreme ultraviolet light EL to tilt at a predetermined angle θ with respect to a gravitational direction G. The angle θ at which extreme ultraviolet light EL tilts with respect to the gravitational direction G may be, e.g., about 1° to about 30°.

In some embodiments, the focus cap 180 may include a spectral purity filter (SPF) that removes unnecessary rays (e.g., visible and infrared rays) from the extreme ultraviolet light EL.

In the case of the laser produced plasma (LPP) method by laser irradiation, debris, e.g., fine particles that did not turn into plasma, may be deposited on surfaces of optical elements (e.g., the collector 130) in the chamber, thereby causing a decrease in operating efficiency, e.g., a decrease in reflectivity and transmissivity, of the optical elements. While a cleaning gas or radicals obtained from a cleaning gas (e.g., hydrogen ($H_2$) and/or hydrogen radicals (H*)) could be provided, such a cleaning gas could be discharged along the backflow and contaminate other configurations of the extreme ultraviolet lithography apparatus. For example, if the cleaning gas were to be discharged along the backflow directed toward a discharge port (e.g., 185 of FIG. 1), it could potentially contaminate a photomask or the like irradiated with the extreme ultraviolet light.

In contrast, the EUV light generator according to some embodiments may prevent the backflow of the cleaning gas by including the airflow control member 170 and the control gas feeder 160. Specifically, as described above, the control gas feeder 160 may supply the control gas BG through the slit 170s of the airflow control member 170. Since the airflow control member 170 may be placed on the chamber 100 along the direction toward the discharge port 185, the control gas BG provided from the slit 170s of the airflow control member 170 may block the airflow flowing through the chamber 100 from flowing back toward the discharge port 185. Accordingly, it is possible to provide an EUV light generator having improved strain resistance.

Referring to FIGS. 4 to 6, in the EUV light generator according to some embodiments, the airflow control member 170 includes a plurality of parts hinged to each other. Although FIGS. 4 to 6 only show that the airflow control member 170 includes three parts hinged to each other (hereinafter, the first to third parts 170A to 170C), this is merely an example, and the number of parts constituting the airflow control member 170 may vary.

The first to third parts 170A to 170C may each have an arcuate structure, e.g., each of the first to third parts 170A to 170C may be curved. The arcuate first to third parts 170A to 170C may be connected to each other to form a ring-shaped airflow control member 170. The first to third parts 170A to 170C may be hinged to each other, e.g., the first to third parts 170A to 170C may be connected to each other at ends thereof by a hinge to form a ring shape.

In some embodiments, the first to third parts 170A to 170C may be hinged by hinge pin 170P. For example, the airflow control member 170 may include three hinge pins 170P that penetrate a first end of the first part 170A and a first end of the second part 170B, penetrate a second end of the first part 170A and a first end of the third part 170C, and penetrate second end of the second part 170B and a second end of the third part 170C, respectively. The first to third parts 170A to 170C may rotate with respect to other parts with the hinge pin 170P as a rotary axis. As an example, as shown in FIG. 5, when the hinge coupling between the first part 170A and the third part 170C is disengaged (i.e., the hinge pin 170P penetrating the first part 170A and the third part 170C is removed), the third part 170C may rotate with respect to the second part 170B, with the hinge pin 170P penetrating the second part 170B and the third part 170C as the rotary axis.

In some embodiments, each of the first to third parts 170A to 170C may include a curved surface plate 172, a lower plate 174, and an upper plate 176, respectively. The curved surface plate 172 may include a curved surface extending in an arc shape. The lower plate 174 may include a plane that extends along the lower part of the curved surface plate 172 and intersects the curved surface of the curved surface plate 172. The upper plate 176 may include a plane that extends along the upper part of the curved surface plate 172 and intersects the curved surface of the curved surface plate 172. Further, the upper plate 176 may face, e.g., overlap, the lower plate 174. In some embodiments, the lower plate 174 and the upper plate 176 may each extend in an outward, e.g., radial, direction from the curved surface plate 172 (i.e., in a direction opposite to the direction toward (e.g., oriented away from) the center of the circle formed by the airflow control member 170).

In some embodiments, at least one of the first to third parts 170A to 170C may further include a protrusion 178. The protrusion 178 may protrude to be insertable between the lower plate 174 and the upper plate 176 of other adjacent parts. As an example, as shown in FIG. 4, the protrusion 178 of the first part 170A may be inserted between the lower plate 174 of the third part 170C and the upper plate 176 of the third part 170C.

The hinge pin 170P may hinge, e.g., attach, the first to third parts 170A to 170C to each other by penetrating the lower plate 174, the upper plate 176, and the protrusion 178. As an example, as shown in FIG. 5, the protrusion 178 of the first part 170A may include a first through hole 170h1, and the lower plate 174 of the third part 170C and the upper plate 176 of the third part 170C may each include a second through hole 170h2. When the protrusion 178 of the first part 170A is inserted between the lower plate 174 of the third part 170C and the upper plate 176 of the third part 170C, the first through hole 170h1 and the second through hole 170h2 may communicate, e.g., be aligned, with each other. The hinge pin 170P may hinge the first part 170A and the second part 170B, by being inserted into the first through hole 170h1 and the second through hole 170h2 that communicate with each other. A width W1 of the first through hole 170h1 and a width W2 of the second through hole 170h2 may be, e.g., about 2 mm to about 3 mm.

In some embodiments, the slit 170s of the airflow control member 170 may be located inside the curved surface plate 172 between the lower plate 174 and the upper plate 176. The slit 170s may penetrate the curved surface plate 172. Further, the slit 170s may extend along at least a part of the arc formed by the curved surface plate 172.

In some embodiments, the curved surface plate 172 may include at least one slit 170s. In an example, the first part 170A and the second part 170B may each include three slits 170s, and the third part 170C may include two slits 170s, e.g., the slits 170s may be spaced apart from each other along the circumference of the airflow control member 170. However, the arrangement and number of slits 170s may vary.

As shown in FIG. 6, although only an example is shown in which a length L1 of the first part 170A and a length L2 of the second part 170B are the same and are each longer than a length L3 of the third part 170C, this is merely an example. The lengths L1, L2, and L3 of the first to third parts 170A to 170C may be the same or different from each other, and may be different from each other as needed. Further, although only an example is shown in which distances L4 at which the plurality of slits 170s are separated from each other are the same as each other, this is merely an example, and the distances L4 at which the slits 170s are separated may be different from each other, if necessary.

Referring to FIGS. 7 and 8, in the EUV light generator according to some embodiments, the airflow control member 170 is installed inside the coupling member 150. For convenience of explanation, the coupling member 150 is shown in the cut form in FIGS. 7 and 8.

For example, as described above, the coupling member 150 may include a mounting portion 154 that provides a region for installing the airflow control member 170. In some embodiments, the mounting portion 154 may have a ring-shaped structure that protrudes from the inner surface of the side wall portion 152, e.g., toward a central axis of the coupling member 150. As an example, the mounting portion 154 may be a screw thread protruding from the inner surface of the side wall portion 152. The airflow control member 170 may be installed inside the coupling member 150 by being placed on the mounting portion 154.

When the airflow control member 170 is installed inside the coupling member 150, at least a part of the hinge couplings of the airflow control member 170 may be provided in a disengaged state, e.g., at least a part of the hinge couplings of the airflow control member 170 may be disengaged during installation of the airflow control member 170. For example, as shown in FIG. 7, the hinge coupling between the first part 170A and the third part 170C may be provided in the mounting portion 154 in a disengaged state.

When the airflow control member 170 is installed inside the coupling member 150, the hinge coupling of the disengaged airflow control member 170 may be fastened again. For example, as shown in FIG. 8, when the airflow control member 170 is placed in the mounting portion 154, the hinge coupling between the first part 170A and the third part 170C may be fastened again by the hinge pin 170P, e.g., after installation of the airflow control member 170 is complete.

As described above in the explanation of FIGS. 1 to 3, the airflow control member 170 including at least one slit 170s may be installed to provide the control gas BG. The EUV light generator according to some embodiments may have improved durability, by including the airflow control member 170 including a plurality of parts hinged to each other, e.g., a plurality of parts connected to each other by a removable pin that allows each of the plurality of parts to swing or move at one end without the removable pin.

If an airflow control member were to not include a plurality of parts hinged to each other, e.g., if the airflow control member were to be a seamless integral ring without multiple prats hinged to each other, excessive stress would have been applied during installation of the airflow control member inside the coupling member 150, and durability would have been degraded. For example, if such an airflow control member were to be installed inside the coupling member 150 by being forcibly displaced only elastically without rotation due to hinge coupling, the stress applied to the airflow control member would have caused local damage to the airflow control member. Further, the control gas BG provided through slits of the airflow control member would have permeated into such a damaged part to accelerate the embrittlement of the airflow control member.

In contrast, according to embodiments, the airflow control member 170 includes multiple parts hinged to each other, e.g., parts capable of engaging/disengaging with each other via a removable pin, to define a ring-shape. Accordingly, stress applied to the airflow control member 170 during installation may be minimized, e.g., adjusted via engaging/disengaging the hinged parts, thereby improving strain resistance and durability of the airflow control member 170.

Figure 9:
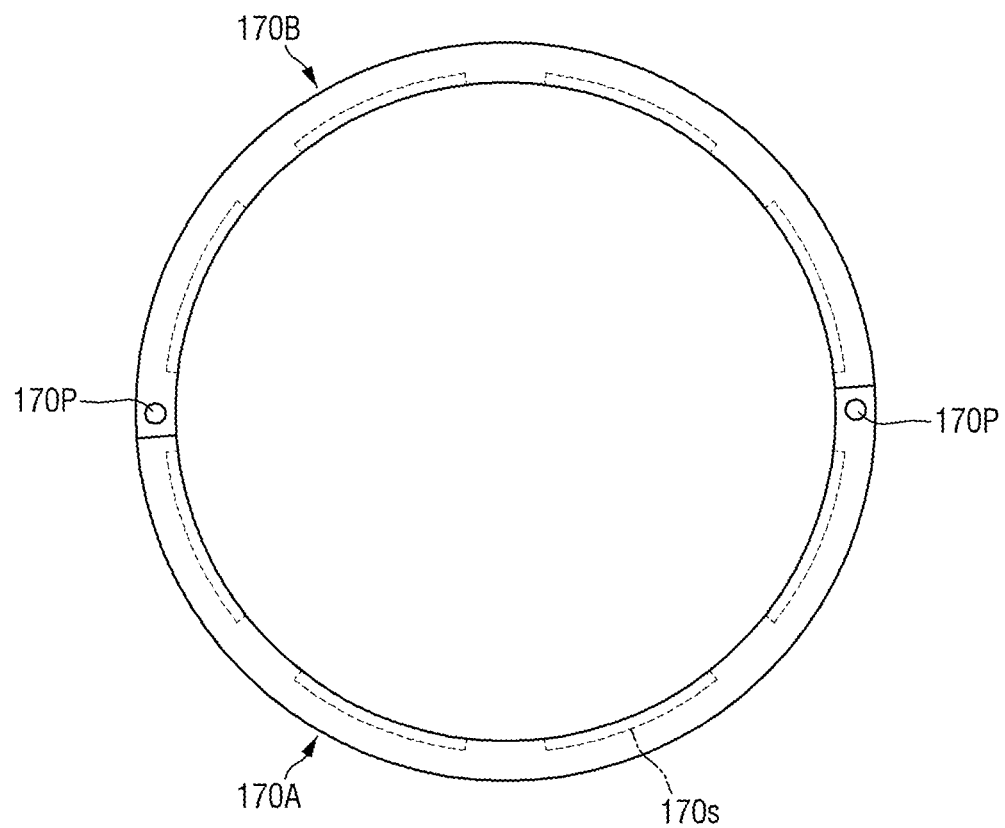
FIGS. 9 and 10 are various other plan views of the airflow control member of the EUV generator according to some embodiments.
Figure 10:
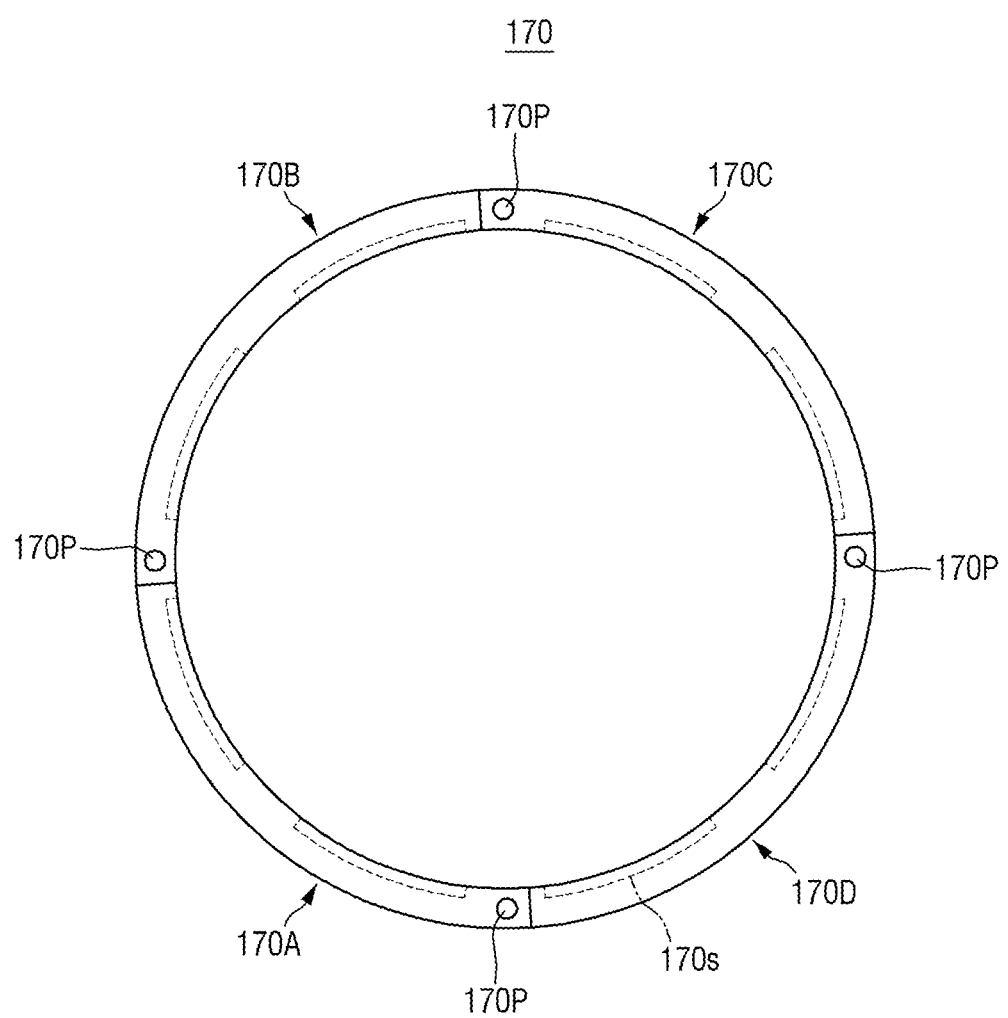

FIGS. 9 and 10 are various other plan views for explaining the airflow control member of the extreme ultraviolet generator according to some embodiments. For convenience of explanation, repeated parts of contents explained above using FIGS. 1 to 8 will be briefly described or omitted.

Referring to FIG. 9, in the EUV light generator according to some embodiments, the airflow control member 170 may include two parts hinged to each other (hereinafter, first and second parts 170A and 170B). As an example, the first and second parts 170A and 170B may each have a semi-circular structure. The semicircular first and second parts 170A and 170B may each be connected to each other to form a ring-shaped airflow control member 170. The first and second parts 170A and 170B may be hinged to each other. For example, the airflow control member 170 may include two hinge pins 170P that penetrate a first end of the first part 170A and a first end of the second part 170B, and penetrate a second end of the first part 170A and a second end of the second part 170B.

Referring to FIG. 10, in the EUV light generator according to some embodiments, the airflow control member 170 may include four parts hinged to each other (hereinafter, first to fourth parts 170A to 170D). As an example, the first to fourth parts 170A to 170D may each have a quadrant structure. The first to fourth quadrant parts 170A to 170D may be connected to each other to form the ring-shaped airflow control member 170. The first to fourth parts 170A to 170D may be hinged to each other. For example, the airflow control member 170 may include four hinge pins 170P that penetrate one end of the first part 170A and one end of the second part 170B, penetrate the other end of the second part 170B and one end of the third part 170C, penetrate the other end of the third part 170C and one end of the fourth part 170D, and penetrate the other end of the first part 170A and the other end of the fourth part 170D.

FIG. 11 is another perspective view of an airflow control member of an EUV light generator according to some embodiments. For convenience of explanation, repeated parts of contents explained above using FIGS. 1 to 10 will be only briefly described or omitted.

Referring to FIG. 11, the EUV light generator according to some embodiments may include a plurality of first through holes 170h1 or a plurality of second through holes 170h2 through which the hinge pin 170P of the airflow control member 170 may penetrate.

As an example, the protrusion 178 of the first part 170A may include a plurality of first through holes 170h1 arranged side by side, and each of the lower plate 174 of the third part 170C and the upper plate 176 of the third part 170C may each include a plurality of second through holes 170h2 arranged side by side. When the protrusion 178 of the first part 170A is inserted between the lower plate 174 of the third part 170C and the upper plate 176 of the third part 170C, at least one of the first through holes 170h1 may communicate with at least one of the second through holes 170*h*2. The hinge pin 170P may hinge the first part 170A and the second part 170B by being inserted into the first through hole 170*h*1 and the second through hole 170*h*2 that communicate with each other. Therefore, an airflow control member 170 which is able to adjust its size, e.g., adjusting a perimeter by adjusting hole alignment, may be provided.

Although only an example is shown in which the protrusion 178 includes three first through holes 170*h*1, and each of the lower plate 174 of the third part 170C and the upper plate 176 of the third part 170C includes only three second through holes 170*h*2, this is merely an example, and the arrangement and number of the first through holes 170*h*1 and the arrangement and number of the second through holes 170*h*2 may vary as needed.

Further, although only an example is shown in which the protrusion 178 includes a plurality of first through holes 170*h*1, and the lower plate 174 of the third part 170C and the upper plate 176 of the third part 170C each include a plurality of second through holes 170*h*2, this is merely an example. As another example, the protrusion 178 may include one first through hole 170*h*1, and the lower plate 174 of the third part 170C and the upper plate 176 of the third part 170C may each include a plurality of second through holes 170*h*2. As still another example, the protrusion 178 may include a plurality of first through holes 170*h*1, and the lower plate 174 of the third part 170C and the upper plate 176 of the third part 170C may each include one through hole 170*h*2.

Hereinafter, an EUV lithography apparatus including the EUV light generator according to exemplary embodiments will be described referring to FIGS. 1 to 12.

Figure 12:
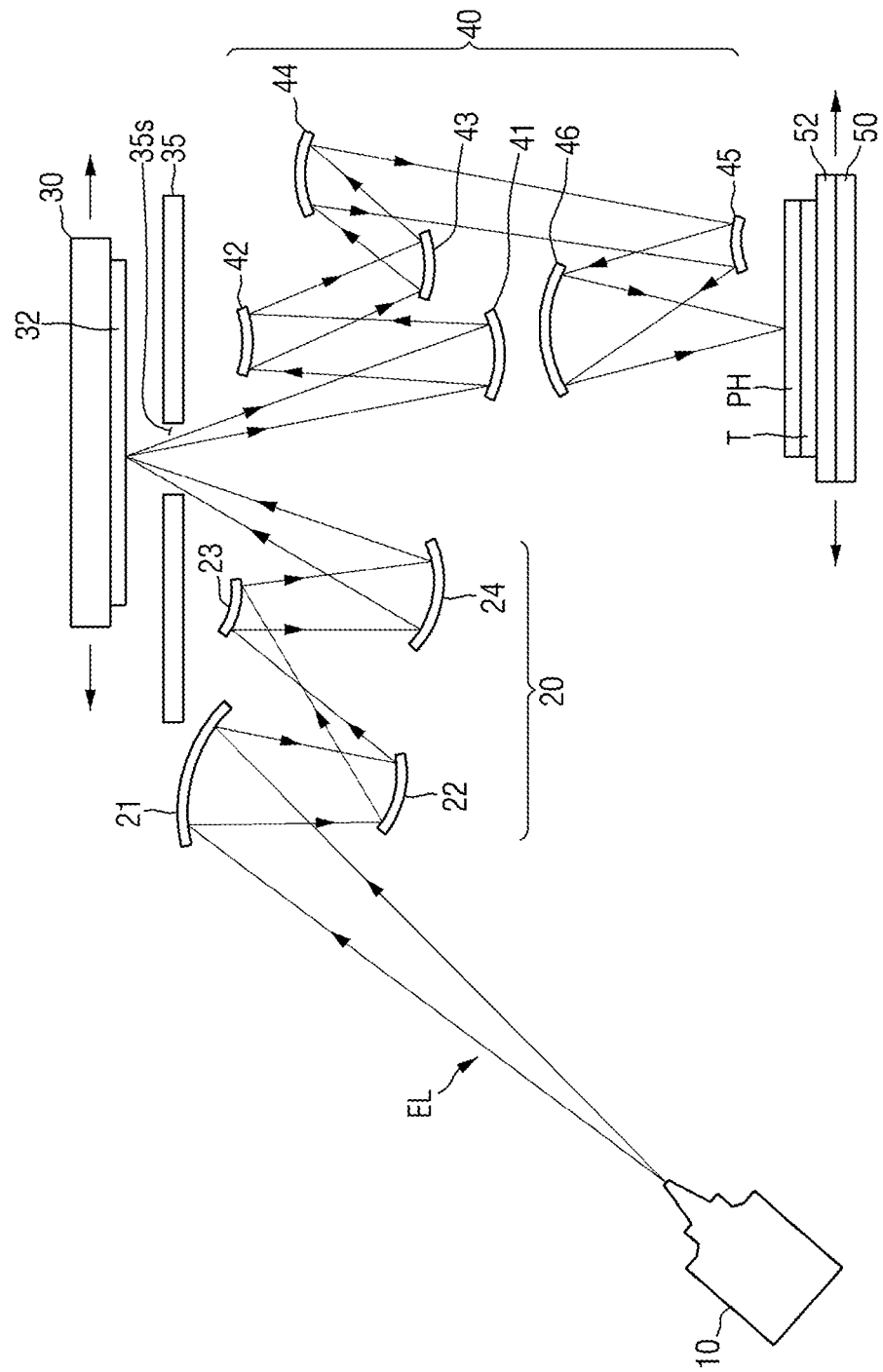
FIG. 12 is a schematic diagram of an EUV lithography apparatus including the EUV generator according to some embodiments.

FIG. 12 is a schematic diagram for explaining EUV lithography apparatus including the EUV light generator according to some embodiments. For convenience of explanation, repeated parts of contents explained above using FIGS. 1 to 11 will be only briefly described or omitted.

Referring to FIG. 12, the extreme ultraviolet lithography apparatus according to some embodiments may include an EUV light generator 10, a contrast optical system 20, a reticle stage 30, a projection optical system 40, and a wafer stage 50.

The EUV light generator 10 may include at least one of the EUV light generators according to the above-described exemplary embodiments referring to FIGS. 1 to 11. The extreme ultraviolet light EL generated from the EUV light generator 10 may be irradiated to the contrast optical system 20. The extreme ultraviolet light EL may have a wavelength of about 1 nm to about 31 nm. For example, the extreme ultraviolet light EL may have a wavelength of about 10 nm to about 14 nm.

The contrast optical system 20 may include first optical systems 21 to 24. The first optical systems 21 to 24 may collect the extreme ultraviolet light EL and transmit it to the reticle stage 30. The first optical systems 21 to 24 may generally and uniformly adjust the intensity distribution of the extreme ultraviolet light EL. For example, the first optical systems 21 to 24 may be made up of a concave mirror, a convex mirror or a combination thereof so that the path of the extreme ultraviolet light EL may be diversified.

Although FIG. 12 only shows that the first optical systems 21 to 24 include four concave mirrors, this is merely an example, and the arrangement and number of mirrors included in the contrast optical system 20 may vary. For example, the contrast optical system 20 may include an independent vacuum chamber, and may further include various lenses and optical elements which are not shown in FIG. 12.

The reticle stage 30 may mount a reticle 32. The reticle stage 30 may control the position of the reticle 32 by moving the reticle 32 in a horizontal direction. For example, the reticle stage 30 may move in the horizontal direction, while mounting the reticle 32 using an electrostatic chuck. The reticle 32 may be attached to the bottom surface of the reticle stage 30 so that the surface on which the optical patterns are formed faces downward, e.g., toward the contrast optical system 20.

In some embodiments, a blinder 35 may be placed below the reticle stage 30, e.g., the blinder 35 may be between the reticle stages 30 and the contrast optical system 20. The blinder 35 may include an opening 35*s*. The opening 35*s* may form the shape of extreme ultraviolet light EL transmitted from the contrast optical system 20 to the reticle 32 mounted on the reticle stage 30. The extreme ultraviolet light EL transmitted from the contrast optical system 20 passes through the opening 35*s* of the blinder 35 and may be irradiated toward the surface of the reticle 32.

The extreme ultraviolet light EL reflected from the reticle 32 mounted on the reticle stage 30 passes through the opening 35*s* and may be transmitted to the projection optical system 40. The projection optical system 40 may receive the extreme ultraviolet light EL that has passed through the opening 35*s* and transmit it to the wafer stage 50. The projection optical system 40 may include second optical systems 41 to 46. The second optical systems 41 to 46 may correct various aberrations.

Although FIG. 12 only shows that the second optical systems 41 to 46 include six concave mirrors, this is merely an example, and the arrangement and number of the mirrors included in the second optical systems 41 to 46 may vary.

The wafer stage 50 may mount a wafer 52. The wafer stage 50 may control the position of the wafer 52 by moving the wafer 52 in the horizontal direction. For example, the wafer stage 50 may move in the horizontal direction, while mounting the wafer 52 using an electrostatic chuck. Accordingly, the projection optical system 40 may project the patterns formed on the reticle 32 onto the wafer 52 in a reduced manner.

Although the EUV lithography device including the EUV light generator 10 according to the exemplary embodiments has been described referring to FIG. 12, embodiments are not limited thereto. As another example, the EUV light generator 10 may be used for an inspection device that utilizes the EUV light generated from the EUV light generator 10. In some embodiments, the inspection device may be a reticle inspection device or a substrate inspection device. In some other embodiments, the inspection device may be metrology equipment for measuring or monitoring process changes, e.g., focus, overlays and critical dimensions (CD), at the time of the lithography process.

Hereinafter, a method of fabricating a semiconductor device using the EUV light generator according to the exemplary embodiments will be described referring to FIGS. 1 to 12.

Figure 13:
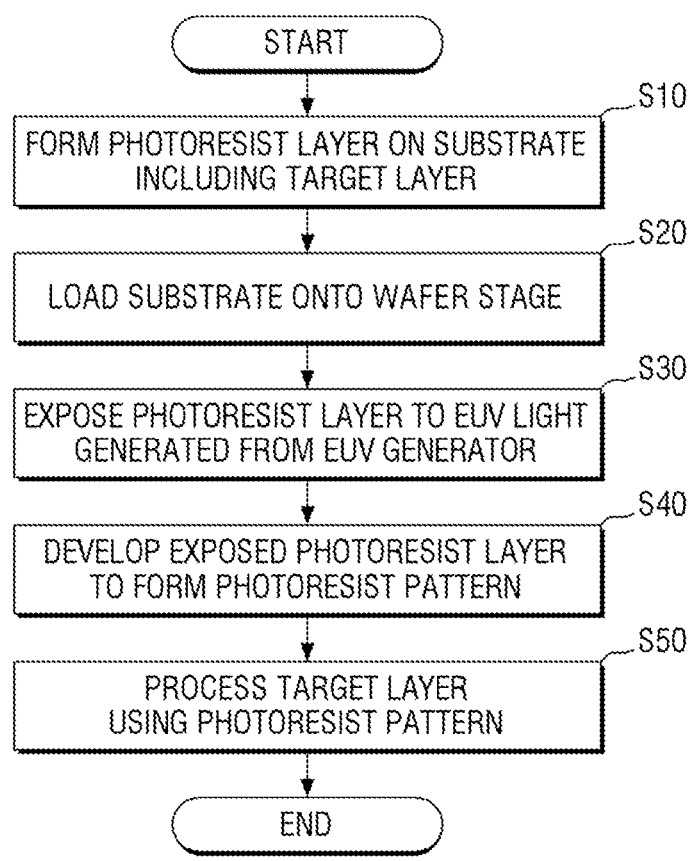
FIG. 13 is a flowchart of a method of fabricating a semiconductor device using the EUV generator according to some embodiments.

FIG. 13 is a flowchart for explaining the method of fabricating a semiconductor device using the EUV light generator according to some embodiments. For convenience of explanation, repeated parts of contents explained above using FIGS. 1 to 12 will be only briefly described or omitted.

Referring to FIG. 13, first, a photoresist film may be formed on a substrate including a target layer (S10). The substrate may include a semiconductor wafer, e.g., the wafer 52 in FIG. 12, and the target layer, e.g., a target layer T in FIG. 12, may be formed on the semiconductor wafer.

For example, the semiconductor wafer may include semiconductor materials, e.g., silicon (Si) and germanium (Ge), or compound semiconductors, e.g., SiC (silicon carbide), GaAs (gallium arsenide), InAs (indium arsenide), InP (indium phosphide), and the like. In some embodiments, the semiconductor wafer may include a conductive region, e.g., an impurity-doped well or an impurity-doped structure. In addition, the semiconductor wafer may include various device isolation structures, e.g., shallow trench isolation (STI). In some embodiments, the semiconductor wafer may have a silicon on insulator (SOI) structure. For example, the semiconductor wafer may include a buried oxide layer (BOX).

The target layer may be a conductive layer or an insulating layer. For example, the target layer may include at least one film of, e.g., an insulating film, a conductive film, a semiconductor film, a metal film, a metal oxide film, a metal nitride film, a polymer film, and a combination thereof. In some embodiments, the target layer may be a part of the semiconductor wafer.

The photoresist film, e.g., a photoresist film PH in FIG. 12, may be formed to cover the target layer. The photoresist film may include a resist material for extreme ultraviolet light.

Next, referring to FIGS. 12 and 13, the substrate on which the photoresist film is formed is mounted on the wafer stage 50 (S20). That is, the substrate on which the photoresist film is formed may be the wafer 52 of FIG. 12.

Next, referring to FIGS. 12 and 13, the photoresist film may be exposed to the extreme ultraviolet light EL generated from the EUV light generator 10 (S30). The photoresist film may be divided into an exposed portion exposed to the extreme ultraviolet light EL and a non-exposed portion not exposed to the extreme ultraviolet light EL. For example, a lithography mask that selectively exposes only a part of the photoresist to the extreme ultraviolet light EL may be used.

Next, referring to FIG. 13, the exposed photoresist film may be developed to form a photoresist pattern on the substrate (S40). For example, a negative tone development (NTD) process or a positive tone development (PTD) process on the exposed photoresist film may be performed.

In the negative tone development process, the photoresist pattern may be formed from the exposed portion of the photoresist film. For example, the exposed portion exposed to the extreme ultraviolet light EL may be cured. The cured exposed portion may remain in the development process to form the photoresist pattern.

In the positive tone development process, the photoresist pattern may be formed from the non-exposed portion of the photoresist film. For example, the exposed portion exposed to the extreme ultraviolet light EL may be melted in the development process. The non-exposed portion that is not exposed to extreme ultraviolet light EL may remain without being melted to form the photoresist pattern.

Next, referring to FIG. 13, the target layer is processed, using the photoresist pattern (S50).

In some embodiments, an etching process which uses the photoresist pattern as an etching mask may be performed to process the target layer. In some other embodiments, an ion implantation process which uses the photoresist pattern as an ion implantation mask may be performed to process the target layer. In yet some other embodiments, a process film may be formed on the target layer exposed by the photoresist pattern to process the target layer. The process film may be, e.g., a conductive layer or an insulating layer. For example, the process film may include at least one film of an insulating film, a conductive film, a semiconductor film, a metal film, a metal oxide film, a metal nitride film, a polymer film, and a combination thereof.

By way of summation and review, the LPP method by laser irradiation may generate EUV light from plasma generated by irradiating a target substance with a laser. However, debris, e.g., fine particles that did not turn into plasma from the target substance, may be deposited on a surface of an optical element around the target substance, thereby causing a decrease in operating efficiency, e.g., a decrease in reflectivity or transmissivity, of the optical element. Therefore, attempts have been made to prevent such contamination of optical elements by utilizing a cleaning gas or radicals obtained from the cleaning gas.

Aspects of the present disclosure provide an EUV light generator having improved strain resistance and durability. Aspects of the present disclosure also provide an EUV lithography apparatus including the EUV light generator having improved strain resistance and durability. Aspects of the present disclosure also provide a method for fabricating a semiconductor device using the EUV generator having improved strain resistance and durability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
   forming a photoresist layer on a substrate, the substrate including a target layer;
   loading the substrate onto a reticle stage;
   exposing the photoresist layer to extreme ultraviolet light generated from an extreme ultraviolet light generator, such that an exposed photoresist layer is formed;
   developing the exposed photoresist layer to form a photoresist pattern; and
   processing the target layer, using the photoresist pattern,
   wherein the extreme ultraviolet light generator includes:
      a collector having a first focus and a second focus,
      a droplet feeder oriented to provide a source droplet toward the first focus,
      a laser generator that irradiates the first focus of the collector with a laser,
      an airflow controller between the first focus and the second focus, the airflow controller having a ring shape, and the airflow controller including:
         at least one slit, and
         a first part and a second part hinged to each other, and
      a control gas feeder that supplies a control gas toward the at least one slit of the airflow controller.

2. The method for fabricating the semiconductor device as claimed in claim 1, wherein each of the first part and the second part has an arc shape.

3. The method for fabricating the semiconductor device as claimed in claim 1, wherein the source droplet includes tin.

4. The method for fabricating the semiconductor device as claimed in claim 1, wherein the control gas includes a hydrogen gas.

5. An extreme ultraviolet light generator, comprising:
a collector including a first focus and a second focus;
a droplet feeder configured to provide a source droplet toward the first focus of the collector;
a laser generator configured to irradiate a laser toward the first focus of the collector;
an airflow controller between the first focus and the second focus of the collector, the airflow controller having a ring shape, and the airflow controller including:
at least one slit, and
a first part and a second part hinged to each other; and
a control gas feeder configured to provide a control gas towards the at least one slit of the airflow controller.

6. The extreme ultraviolet light generator as claimed in claim 5, further comprising a cleaning gas feeder configured to provide a cleaning gas for cleaning debris generated from the source droplet, the control gas feeder being configured to block backflow of the cleaning gas toward the second focus.

7. The extreme ultraviolet light generator as claimed in claim 5, wherein each of the first part and the second part includes:
a curved surface plate extending in an arc shape;
a lower plate that extends along a lower part of the curved surface plate and intersects the curved surface plate;
an upper plate that extends along an upper part of the curved surface plate and faces the lower plate; and
the at least one slit inside the curved surface plate between the lower plate and the upper plate.

8. The extreme ultraviolet light generator as claimed in claim 7, wherein:
the first part further includes a protrusion inserted between the lower plate of the second part and the upper plate of the second part, and
the airflow controller includes a hinge pin that penetrates the lower plate of the second part, the upper plate of the second part, and the protrusion of the first part.

9. The extreme ultraviolet light generator as claimed in claim 5, wherein each of the first part and the second part includes the at least one slit.

10. The extreme ultraviolet light generator as claimed in claim 5, wherein the source droplet includes tin.

11. The extreme ultraviolet light generator as claimed in claim 5, wherein the control gas includes hydrogen gas.

12. An extreme ultraviolet light generator, comprising:
a chamber;
a laser generator configured to irradiate a laser into the chamber;
a droplet feeder configured to provide a source droplet into the chamber, the source droplet being configured to be irradiated by the laser to generate extreme ultraviolet light;
a focus cap with a discharge port, the discharge port being configured to emit the extreme ultraviolet light;
a collector in the chamber, the collector being configured to concentrate the extreme ultraviolet light generated from the source droplet toward the discharge port;
a coupling member that connects the chamber and the focus cap;
a ring-shaped airflow controller inside the coupling member, the ring-shaped airflow controller including:
at least one slit, and
a first part and a second part hinged to each other; and
a control gas feeder configured to provide a control gas into the chamber through the at least one slit.

13. The extreme ultraviolet light generator as claimed in claim 12, further comprising a cleaning gas feeder configured to provide a cleaning gas into the chamber, the cleaning gas to clean debris generated from the source droplet, and the control gas feeder to block backflow of the cleaning gas toward the discharge port.

14. The extreme ultraviolet light generator as claimed in claim 13, wherein the cleaning gas includes at least one of hydrogen gas and hydrogen radical.

15. The extreme ultraviolet light generator as claimed in claim 12, wherein:
the collector has a first focus located on the source droplet irradiated with the laser, and a second focus located on the discharge port, and
the collector reflects the extreme ultraviolet light generated from the source droplet and concentrates the extreme ultraviolet light on the second focus.

16. The extreme ultraviolet light generator as claimed in claim 12, wherein:
the airflow controller further includes a hinge pin that penetrates a first end of the first part and a first end of the second part, and
the second part rotates with respect to the first part with the hinge pin as a rotary axis.

17. The extreme ultraviolet light generator as claimed in claim 12, wherein the focus cap has a hollow cone shape, the extreme ultraviolet light being transmitted through the focus cap toward the discharge port.

18. The extreme ultraviolet light generator as claimed in claim 12, wherein the coupling member includes:
a side wall portion having a hollow truncated cone shape oriented toward the discharge port, the extreme ultraviolet light being transmitted through the coupling member; and
a mounting portion protruding from an inner surface of the side wall portion, the airflow controller being installed on the mounting portion.

19. The extreme ultraviolet light generator as claimed in claim 18, wherein the mounting portion is a screw thread that protrudes from the inner surface of the side wall portion.

20. The extreme ultraviolet light generator as claimed in claim 18, further comprising a nozzle connected to the control gas feeder, the nozzle penetrating the side wall portion and providing the control gas toward the at least one slit.

* * * * *